United States Patent
Schenck

(10) Patent No.: US 6,624,680 B2
(45) Date of Patent: Sep. 23, 2003

(54) REDUCTION OF PROPAGATION DELAY DEPENDENCE ON SUPPLY VOLTAGE IN A DIGITAL CIRCUIT

(75) Inventor: Stephen R. Schenck, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/998,827

(22) Filed: Dec. 3, 2001

(65) Prior Publication Data

US 2002/0084820 A1 Jul. 4, 2002

Related U.S. Application Data

(60) Provisional application No. 60/258,660, filed on Dec. 29, 2000.

(51) Int. Cl.[7] .............................................. H03H 11/26
(52) U.S. Cl. ...................... 327/262; 327/264; 327/278; 327/285
(58) Field of Search ................................ 327/261, 262, 327/263, 264, 271, 272, 276, 277, 278, 283, 284, 285, 290, 341, 362, 392

(56) References Cited

U.S. PATENT DOCUMENTS

| | | | | |
|---|---|---|---|---|
| 4,746,823 A | * | 5/1988 | Lee | 327/262 |
| 5,057,722 A | * | 10/1991 | Kobatake | 327/288 |
| 5,130,564 A | * | 7/1992 | Sin | 327/264 |
| 5,164,621 A | * | 11/1992 | Miyamoto | 327/262 |
| 5,428,310 A | * | 6/1995 | Casper et al. | 327/262 |
| 5,600,273 A | * | 2/1997 | Hall et al. | 327/261 |
| 5,917,357 A | * | 6/1999 | Kwon | 327/262 |
| 5,917,762 A | * | 6/1999 | Zheng et al. | 365/194 |
| 6,034,557 A | * | 3/2000 | Schultz et al. | 327/226 |
| 6,060,930 A | * | 5/2000 | Choi | 327/276 |
| 6,121,812 A | * | 9/2000 | Tsukikawa | 327/280 |
| 6,150,864 A | * | 11/2000 | Yach et al. | 327/288 |
| 6,262,616 B1 | * | 7/2001 | Srinivasan et al. | 327/264 |

* cited by examiner

Primary Examiner—Timothy P. Callahan
Assistant Examiner—Hai L. Nguyen
(74) Attorney, Agent, or Firm—Robert D. Marshall, Jr.; W. James Brady, III; Frederick J. Telecky, Jr.

(57) ABSTRACT

In one embodiment, a digital circuit element has a propagation delay that is substantially constant over a range of supply voltages applied to the digital circuit element. In another embodiment, a digital circuit element may include an input node, an output node, and at least one gate coupling the input node and the output node. A plurality of possible voltage transition curves may be associated with a corresponding change of a first voltage at the input node over time, each voltage transition curve being determined by a corresponding supply voltage and the curves intersecting within a relatively narrow range of voltages. The gate may be operable to change a second voltage at the output node in response to the first voltage reaching a threshold voltage of the gate, and the threshold voltage may be set within the relatively narrow range of voltages in which the voltage transition curves intersect in order to reduce the dependence of the propagation delay on the supply voltage. In yet another embodiment, a digital circuit element having a propagation delay that is substantially constant over a range of supply voltages applied to the digital circuit element includes an input node, an output node, and at least one gate coupling the input node and the output node. The gate is operable to change a first voltage at the output node in response to a second voltage at the input node reaching a threshold voltage of the gate, and the threshold voltage of the gate is set such that a delay separating an initial change in the first voltage from an initial change in the second voltage is substantially constant over a range of supply voltages applied to the digital circuit element.

15 Claims, 3 Drawing Sheets

REDUCTION OF PROPAGATION DELAY DEPENDENCE ON SUPPLY VOLTAGE IN A DIGITAL CIRCUIT

This application claims priority under 35 USC §119(e)(1) of Provisional Application No. 60/258,660, filed Dec. 29, 2000.

TECHNICAL FIELD OF THE INVENTION

This invention relates in general to the field of digital circuits and in particular to reducing propagation delay dependence on supply voltage in a digital circuit.

BACKGROUND OF THE INVENTION

The supply voltage in an integrated circuit (IC) does not remain precisely constant. Instead, the supply voltage fluctuates as a result of noise attributable to the normal operation of the IC. Such noise may be caused, for example, by inductive coupling occurring between the IC and external devices. Typically, supply voltage fluctuation is an undesirable occurrence. For example, in analog ICs, a filter may be used to reduce fluctuation in the supply voltage caused by noise. However, for a number of reasons, similar filters may not be suitable for use in digital ICs. Historically, designers, manufacturers, and end users of digital ICs have simply tolerated supply voltage fluctuation caused by noise, despite the fact that supply voltage fluctuation may adversely affect the performance of the IC. In an all-digital phase-locked loop (ADPLL), for example, a delay circuit is typically used to set the frequency of the loop. Since the propagation delay of a signal through the delay circuit may vary over a range of supply voltages, supply voltage fluctuation attributable to noise may cause the frequency of the ADPLL to fluctuate, a phenomenon commonly known as "jitter," thereby adversely affecting the performance of the ADPLL and the digital IC containing the ADPLL.

SUMMARY OF THE INVENTION

According to the present invention, disadvantages and problems associated with propagation delay dependence on supply voltage in digital circuits are substantially reduced or eliminated.

According to one embodiment of the present invention, a digital circuit element has a propagation delay that is substantially constant over a range of supply voltages applied to the digital circuit element.

In another embodiment of the present invention, a digital circuit element having a propagation delay that is substantially constant over a range of supply voltages applied to the digital circuit element includes an input node, an output node, and at least one gate coupling the input node and the output node. A plurality of possible voltage transition curves is associated with a corresponding change of a first voltage at the input node over time, each voltage transition curve being determined by a corresponding supply voltage and the curves intersecting within a relatively narrow range of voltages. The gate is operable to change a second voltage at the output node in response to the first voltage reaching a threshold voltage of the gate, and the threshold voltage is set within the relatively narrow range of voltages in which the voltage transition curves intersect in order to reduce the dependence of the propagation delay on the supply voltage.

In yet another embodiment, a digital circuit element having a propagation delay that is substantially constant over a range of supply voltages applied to the digital circuit element includes an input node, an output node, and at least one gate coupling the input node and the output node. The gate is operable to change a first voltage at the output node in response to a second voltage at the input node reaching a threshold voltage of the gate, and the threshold voltage of the gate is set such that a delay separating an initial change in the first voltage from an initial change in the second voltage is substantially constant over a range of supply voltages applied to the digital circuit element.

The present invention provides a number of important technical advantages over previous digital circuit elements. Properly setting the gate threshold voltage according to the present invention allows for the design, manufacture, and use of delay elements providing propagation delay that is substantially constant over a range of supply voltages, reducing or eliminating the necessity of filtering or making other changes to the supply voltage. Accordingly, jitter in ADPLLs and other digital circuits may be reduced, and the frequency of these digital circuits may be more precisely controlled, in order to improve performance.

Digital circuits incorporating one or more of these or other technical advantages are well suited for use in modern digital systems. Other technical advantages are readily apparent to those skilled in the art from the following figures, descriptions, and claims.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE INVENTION

Figure 1:
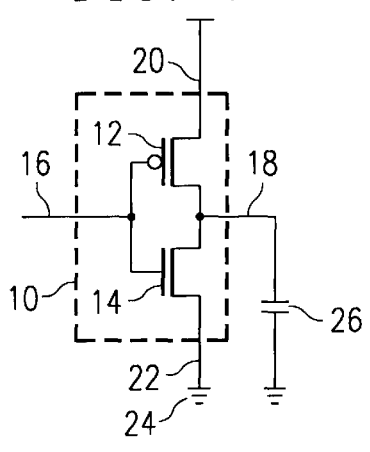
FIG. 1 illustrates an exemplary inverting gate.

FIG. 1 illustrates an exemplary inverting gate 10 that includes a p-channel transistor 12 and an n-channel transistor 14. Although an exemplary inverting gate 10 is primarily described, the present invention encompasses any suitable digital logic gate, such as, for example, an AND gate, a NAND gate, an OR gate, or a NOR gate. Transistors 12 and 14 may have any suitable characteristics according to particular needs. The gate terminals of both transistors 12 and 14 are coupled to an input node 16, and the drain terminals of both transistors are coupled to an output node 18. The source terminal of p-channel transistor 12 is coupled to a supply node 20, and the source terminal of n-channel transistor 14 is coupled to a supply node 22. The difference between the voltage at supply node 20 ($V_{DD}$) and the voltage at supply node 22 ($V_{SS}$) is commonly referred to as the supply voltage. Where supply node 22 is coupled to ground 24, as in FIG. 1, the supply voltage is equal to $V_{DD}$. However, one skilled in the art will appreciate that the present invention contemplates any suitable $V_{SS}$ and any suitable $V_{DD}$. For example, $V_{SS}$ may be a negative voltage and $V_{DD}$ may be a positive voltage, resulting in a supply voltage equal to $V_{DD}$ minus $V_{SS}$.

In one embodiment, $V_{DD}$ determines the "high" voltage and $V_{SS}$ determines the "low" voltage of a node. For example: if $V_{DD}$ equals 1.6V and $V_{SS}$ equals 0V, the node voltage representing a "1" may be 1.6V and the node voltage representing a "0" may be 0V; if $V_{DD}$ equals 1.4V and $V_{SS}$ equals 0V, the node voltage representing a "1" may be 1.4V and the node voltage representing a "0" may be 0V; and so on. Due to noise, the supply voltage does not remain precisely constant, but instead varies with a range. For example, the supply voltage may fluctuate between 1V and 2V.

Inverting gate 10 changes the voltage at output node 18 from low to high in response to a change in the voltage at input node 16 from high to low and conversely changes the voltage at output node 18 from high to low in response to a change in the voltage at input node 16 from low to high. The threshold voltage of a gate is commonly considered the input voltage at which the output voltage begins to change from low to high or from high to low. For example, using this definition, the threshold voltage of inverting gate 10 is the voltage at input node 16 at which the voltage at output node 18 begins to change from low to high or from high to low. The threshold voltage of inverting gate 10 is between $V_{DD}$ and $V_{SS}$. Accordingly, as the voltage at input node 16 changes from low to high, the voltage at output node 18 will begin to change from high to low when the voltage at input node 16 reaches the threshold voltage of inverting gate 10. Similarly, as the voltage at input node 16 changes from high to low, the voltage at output node 18 will begin to change from low to high when the voltage at input node 16 reaches the threshold voltage of inverting gate 10.

Coupled to output node 18 is a capacitance 26 or other suitable load. Capacitance 26 may include stray lead capacitance, gate capacitance, drain capacitance, or any other capacitance caused by one or more devices internal or external to inverting gate 10. Additionally, capacitance 26 may be caused by the operation of a capacitor coupled to output node 18. In this example, capacitance 26 functions as a load driven by inverting gate 10. In one embodiment, capacitance 26 and n-channel transistor 14 collectively discharge the voltage at output node 18 from approximately $V_{DD}$ to approximately $V_{SS}$ when the voltage at input node 16 changes from low to high and p-channel transistor 12 and n-channel transistor 14 are turned "off" and "on," respectively. Alternatively, capacitance 26 impedes the transition of the voltage at output node 18 from approximately $V_{SS}$ to approximately $V_{DD}$ when the voltage at input node 16 changes from high to low and p-channel transistor 12 and n-channel transistor 14 are turned "on" and "off," respectively. Although exemplary inverting gate 10 has been described primarily as driving capacitance 26, the present invention contemplates inverting gate 10 coupled in any suitable manner to any suitable load.

Figure 2:
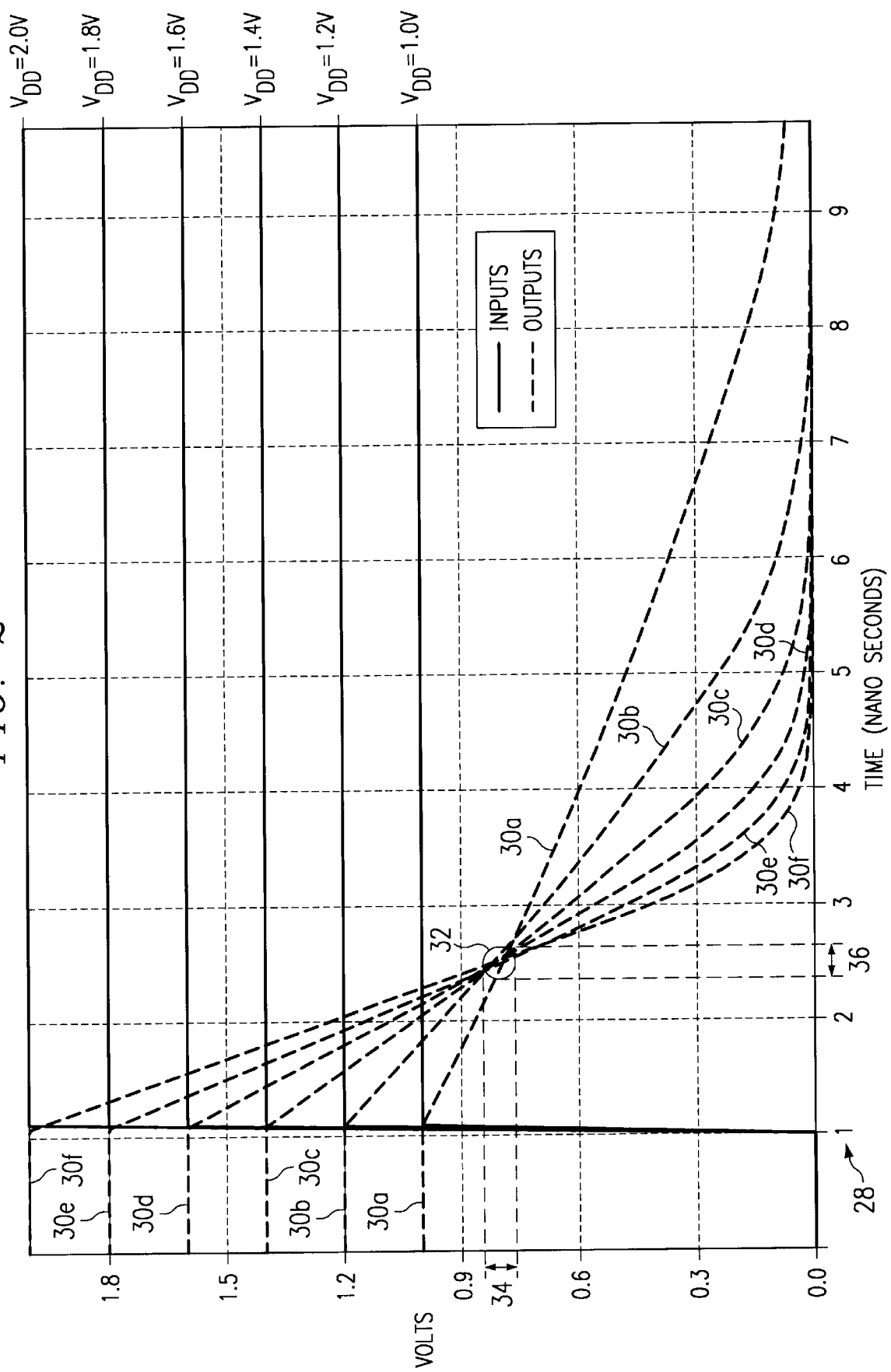
FIG. 2 illustrates exemplary plots of the output voltage of an inverting gate versus time.

FIG. 2 illustrates exemplary plots 30 of the output voltage of inverting gate 10 versus time. Plots 30 reflect what may be referred to as voltage transition curves. In this particular example, the capacitance 26 driven by inverting gate 10 is equal to 1 pF, although, as described above, any suitable load may be used. Before a time 28 (equal to 1 ns), the voltage at input node 16 is low and the voltage at output node 18 is high. Since supply node 22 is coupled to ground, the voltage at input node 16 is equal to 0V before time 28. As discussed above, $V_{DD}$ may fluctuate between 1V and 2V. Accordingly, before time 28, the voltage at output node 18 is equal to either 1V, 1.2V, 1.4V, 1.6V, 1.8V, or 2V, each voltage corresponding to a $V_{DD}$ of 1V, 1.2V, 1.4V, 1.6V, 1.8V, or 2V, respectively.

At time 28, the voltage at input node 16 changes from low to high, and the voltage at output node 18 begins to change from high to low, being discharged by capacitance 26 and n-channel transistor 14. The shape of a particular plot 30 of the voltage at output node 18 versus time after time 28 depends on $V_{DD}$. For example: plot 30a of the voltage at output node 18 versus time at a $V_{DD}$ of 1V is less steep than plot 30b of the voltage at output node 18 versus time at a $V_{DD}$ of 1.2V; plot 30b is less steep than plot 30c of the voltage at output node 18 versus time at a $V_{DD}$ of 1.4V; and so on. The steepness of a particular plot 30, which represents the rate of discharge of the voltage at output node 18, may be determined by the amount of current being discharged, which in turn is determined by $V_{DD}$. For example, when $V_{DD}$ is higher, there is more current being discharged, resulting in an increased discharge rate and a steeper plot 30. Similarly, when $V_{DD}$ is lower, there is less current being discharged, resulting in a decreased discharge rate and a flatter plot 30.

The amount of time it takes the voltage at output node 18 to reach a particular voltage after a change in the voltage at input node 16 from low to high or high to low may be referred to as the delay for inverting gate 10. The delay in reaching a particular voltage may vary, due to the fact that the delay may depend on $V_{DD}$. For example, plot 30a reaches 0.9V approximately 0.83 ns after the voltage at input node 16 changes from low to high, and plot 30f reaches 0.9V approximately 1.35 ns after the voltage at input node 16 changes from low to high. Since all other plots 30 reach 0.9V after plot 30a and before plot 30f, the delay in reaching 0.9V may vary, in this example, as much as approximately 0.52 ns.

Plots 30 intersect within a relatively narrow region 32 defined by a relatively narrow range 34 of voltages and a relatively narrow range 36 of delays. Compared with the delay in reaching a voltage outside relatively narrow range 34 of voltages, the delay in reaching a voltage within narrow range 34 of voltages is substantially independent of $V_{DD}$ and therefore substantially constant over changes in $V_{DD}$. For example, plot 30a reaches approximately 0.81V approximately 1.46 ns after the voltage at input node 16 changes from low to high, and plot 30b reaches approximately 0.81V approximately 1.52 ns after the voltage at input node 16 changes from low to high. Since all other plots 30 reach 0.81V after plot 30a and before plot 30b, the delay in reaching approximately 0.81V may vary, in this example, by only as much as approximately 0.06 ns, which is a significantly smaller variation than approximately 0.52 ns. While the discharge of the voltage at output node 18 is primarily described, the present invention also contemplates a transition of the voltage at output node 18 from low to high similarly characterized by a set of plots 30 of the voltage at output node 18 versus time, the shape of each plot 30 being dependent on $V_{DD}$, and a relatively narrow region 32 within which the plots 30 intersect.

Figure 3:
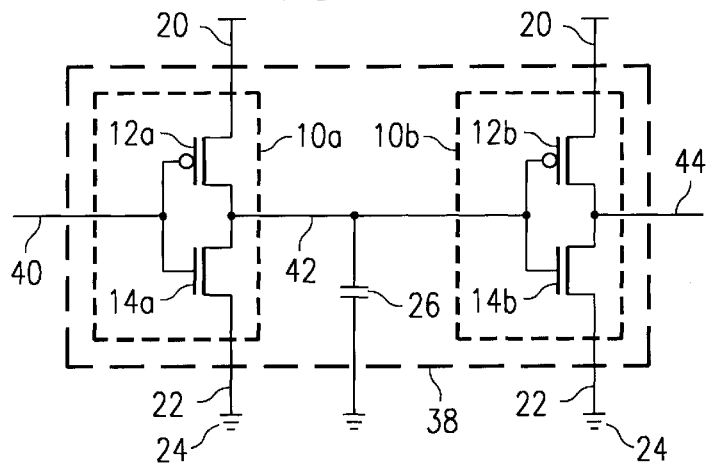
FIG. 3 illustrates an exemplary delay element including two inverting gates.

FIG. 3 illustrates an exemplary delay element 38 that includes two exemplary inverting gates 10a and 10b coupled in series. Although inverting gates 10 are primarily described, the present invention encompasses any suitable digital logic gates, such as, for example, AND gates, NAND gates, OR gates, NOR gates, in any suitable combination. Moreover, although a particular delay element is described, the present invention contemplates any suitable circuit element that includes any suitable number and type of devices. Additionally, the present invention encompasses any digital circuit in which propagation delay might otherwise vary over a range of supply voltages due to noise or for any other reason. Input node 40 is coupled to the gate terminals of p-channel transistor 12a and n-channel transistor 14a, and the drain terminals of p-channel transistor 12a and n-channel transistor 14a are coupled to node 42. Also coupled to node 42 is capacitance 26, which functions as a load. As discussed above, capacitance 26 may include stray lead capacitance, gate capacitance, drain capacitance, capacitance associated with operation of a capacitor coupled to node 42, or any other suitable capacitance. The gate terminals of p-channel transistor 12b and n-channel transistor 14b are also coupled to node 42, making the output of inverting gate 10a the input of inverting gate 10b. Output node 44 is coupled to the drain terminals of p-channel transistor 12b and n-channel transistor 14b. The source terminals of p-channel transistor 12a and 12b are coupled to supply node 20, and the source terminals of n-channel transistors 14a and 14b are coupled to supply node 22. As discussed above, the difference between the voltage at supply node 20 ($V_{DD}$) and the voltage at supply node 22 ($V_{SS}$) is commonly referred to as the supply voltage, and $V_{DD}$ and $V_{SS}$ determine the "high" voltage and "low" voltage, respectively, of nodes within delay element 38.

Inverting gate 10a changes the voltage at node 42 from low to high in response to a change in the voltage at input node 40 from high to low and conversely changes the voltage at node 42 from high to low in response to a change in the voltage at input node 40 from low to high. Similarly, inverting gate 10b changes the voltage at output node 44 from low to high in response to a change in the voltage at node 42 from high to low and conversely changes the voltage at output node 44 from high to low in response to a change in the voltage at bode 42 from low to high.

Following a change in the voltage at node 40 from low to high or from high to low, there is a delay in the voltage at node 42 reaching the threshold voltage of inverting gate 10b. As discussed above, the threshold voltage of a gate is commonly considered the input voltage at which the output voltage begins to change from low to high or from high to low. The delay in the voltage at node 42 reaching the threshold voltage of inverting gate 10b may vary, due to the fact that $V_{DD}$ may vary as a result of noise or otherwise. For example, applying the discussion of FIG. 2 to delay element 38 of FIG. 3, the voltage at node 42 (which is the output of inverting gate 10a and the input of inverting gate 10b) may reach 0.9V approximately 0.83 ns after the voltage at input node 40 changes from low to high when $V_{DD}$ is equal to 1V, and the voltage at node 42 may reach 0.9V approximately 1.35 ns after the voltage at input node 40 changes from low to high when $V_{DD}$ is equal to 2V, resulting in a variation in delay of 0.52 ns. Accordingly, if the threshold voltage of inverting gate 10b is equal to 0.9V, the delay in the voltage at node 42 reaching the threshold voltage of inverting gate 10b may vary as much 0.52 ns.

However, according to the present invention, if the threshold voltage of inverting gate 10b is equal to a substantially constant voltage in the relatively narrow range 34 of voltages (or another suitable relatively narrow range of voltages), the delay in reaching the threshold voltage of inverting gate 10b will be substantially constant compared with the delay in reaching a voltage outside range 34 of voltages. For example, the voltage at node 42 will reach approximately 0.81V approximately 1.46 ns after the voltage at input node 40 changes from low to high when $V_{DD}$ is equal to 1V, and the voltage at node 42 will reach approximately 0.81V approximately 1.52 ns after the voltage at input node 40 changes from low to high when $V_{DD}$ is equal to 1.2V, resulting in a variation in delay of 0.06 ns. As a result, if the threshold voltage of inverting gate 10b is equal to approximately 0.81V, delay in the voltage at node 42 reaching the threshold voltage of inverting gate 10b may only vary by approximately 0.06 ns, which is a significantly smaller variation than the approximately 0.52 ns variation associate with a threshold voltage of inverting gate 10b equal to 0.9V. Therefore, if the threshold voltage of inverting gate 10b is set at a substantially constant voltage within a relatively narrow range 34 of voltages, the delay in reaching the threshold voltage of inverting gate 10b will be substantially constant over a range of supply voltages. Those skilled in the art will appreciate that, while a transition in the voltage at node 42 from high to low is primarily described, the present invention similarly contemplates a transition of the voltage at node 40 from low to high.

The propagation delay through delay element 38 is a function of the delay in the voltage at node 42 reaching the threshold voltage of inverting gate 10b. For example, if the delay in reaching the threshold voltage of inverting gate 10b is 1.5 ns, it will take a signal at least 1.5 ns to propagate through delay element 38 since the output node voltage will not begin to change until the threshold voltage of inverting gate 10b is reached. In one embodiment, the propagation delay through delay element 38 is almost entirely due to the delay in reaching the threshold voltage of inverting gate 10b. Accordingly, if the delay in reaching the threshold voltage of inverting gate 10b is substantially constant over a range of supply voltages, the propagation delay of delay element 38 will also be substantially constant over that range of supply voltages. While exemplary delay element 38 consists of only two inverting gates 10, delay element 38 may consist of any number of inverting gates 10 coupled in series. For example, one or more inverting gates 10 may be added to delay element 38 to increase the propagation delay of a signal through delay element 38.

Figure 4:
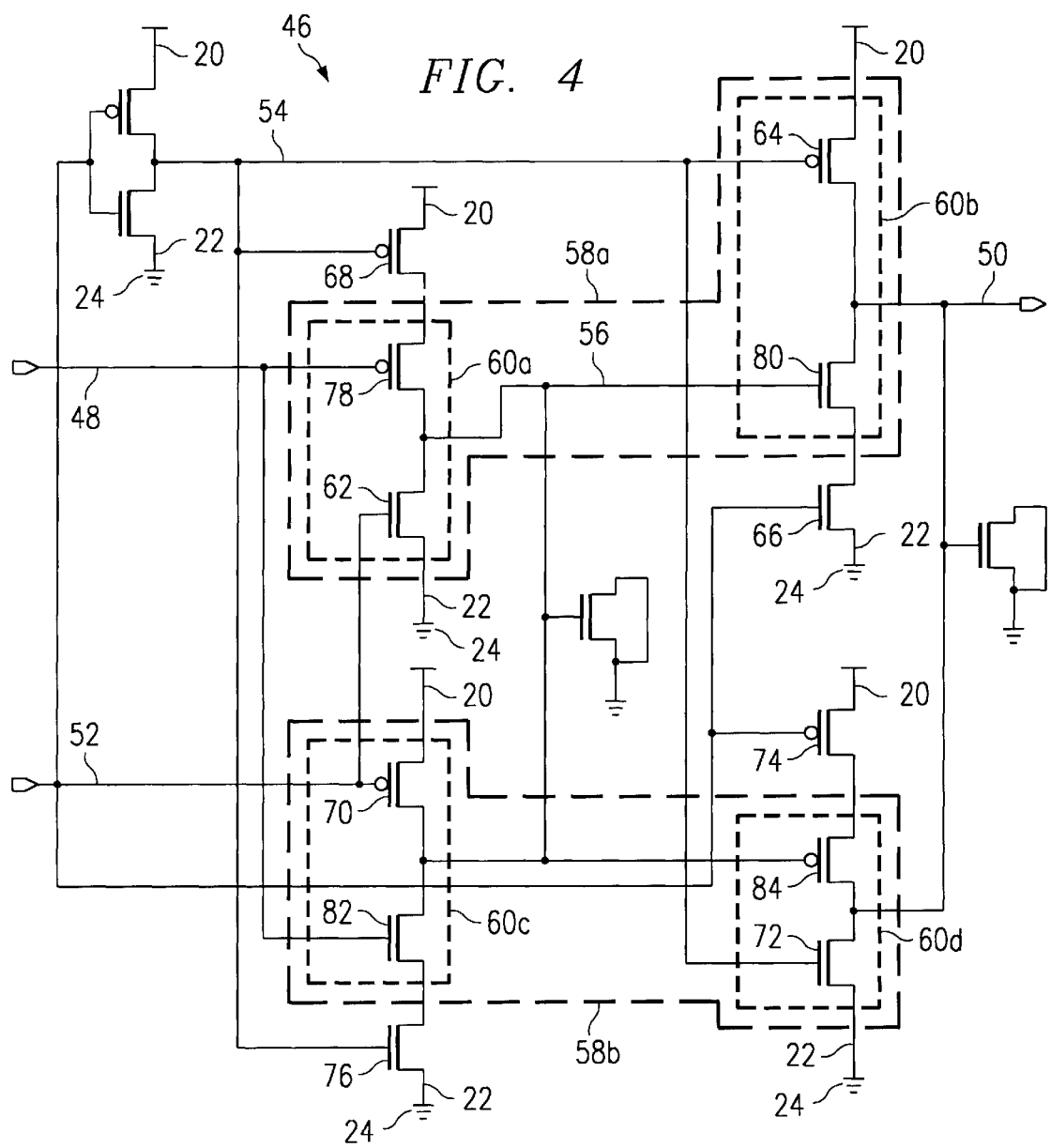
FIG. 4 illustrates an exemplary delay element including two inverting gate pairs.

FIG. 4 illustrates an exemplary delay element 46 including two inverting gate pairs 58a and 58b. Although a particular delay element 46 is described, as discussed above the present invention contemplates any suitable circuit element that includes any number and type of devices. Additionally, as discussed above, the present invention encompasses any digital circuit in which propagation delay might otherwise vary over a range of supply voltages.

The source terminals of various p-channel transistors in delay element 46 are coupled to supply node 20, and the source terminals of various n-channel transistors are coupled to supply node 22. Accordingly, as discussed above, the difference between the voltage at supply node 20 ($V_{DD}$) and the voltage at supply node 22 ($V_{SS}$) is the supply voltage, and $V_{DD}$ and $V_{SS}$ determine the "high" voltage and "low" voltage, respectively, of nodes within delay element 46. Where supply node 22 is coupled to ground 24, as in FIG. 4, the supply voltage is equal to $V_{DD}$. However, as discussed above, the present invention contemplates any suitable $V_{SS}$ and any suitable $V_{DD}$.

Node 48 is the input node of delay element 46, and node 50 is the output node of delay element 46. Delay element 46 changes the voltage at node 50 from low to high in delayed response to a change in the voltage at node 48 from low to high and conversely changes the voltage at node 50 from high to low in delayed response to a change in the voltage at node 48 from high to low. Nodes 52 and 54 may be used to enable and disable different gates in delay element 46, and a change in the voltage at node 52 precedes a change in the voltage at node 48. Node 56 may be used to couple the gate pairs in delay element 46.

Gate pair 58a includes gate 60a and gate 60b. Gate pair 58a is enabled before the voltage at node 48 changes from low to high and disabled before the voltage at node 48 changes from high to low. Accordingly, gate pair 58*a* "controls" the operation of delay element 46 when the input voltage changes from low to high. Gate pair 58*b* includes gate 60*c* and gate 60*d* and is enabled before the voltage at node 48 changes from high to low and disabled before the voltage at node 48 changes from low to high. Accordingly, gate pair 58*b* "controls" the operation of delay element 46 when the input voltage changes from high to low.

As previously mentioned, nodes 52 and 54 determine which of gate pairs 58 controls the operation of delay element 46 by enabling one of gate pairs 58 and disabling the other. For example, before the voltage at node 48 changes from low to high, the voltage at node 52 changes from low to high, turning on n-channel transistor 62. When n-channel transistor 62 is turned "on," gate 60*a* is enabled and can change the voltage at node 56 from high to low in response to a change in the voltage at node 48 from low to high. When the voltage at node 52 changes from low to high, the voltage at node 54 changes from high to low, turning "on" p-channel transistor 64. When p-channel transistor 64 is turned "on," gate 60*b* is enabled and can change the voltage at node 50 from low to high in response to a change in the voltage at node 56 from high to low. Conversely, when the voltage at node 52 is low, n-channel transistor 66 is turned "off," which disables gate 60*b*, and, when the voltage at node 54 is high, p-channel transistor 68 is turned "off," which disables gate 60*a*. Accordingly, when gate 60*a* and gate 60*b* are enabled, gate pair 58*a* is enabled, and delay element 46 can change the voltage at node 50 from low to high in delayed response to a change in the voltage at node 48 from low to high. Alternatively, before the voltage at node 48 changes from high to low, the voltage at node 52 changes from high to low, turning "on" p-channel transistor 70. When p-channel transistor 70 is turned "on," gate 60*c* is enabled and can change the voltage at node 56 from low to high in response to a change in the voltage at node 48 from high to low. When the voltage at node 52 changes from high to low, the voltage at node 54 changes from low to high, turning "on" n-channel transistor 72. When n-channel transistor 72 is turned "on," gate 60*d* is enabled and can change the voltage at node 50 from high to low in response to a change in the voltage at node 56 from low to high. Conversely, when the voltage at node 52 is high, p-channel transistor 74 is turned "off," which disables gate 60*d*, and, when the voltage at node 54 is low, n-channel transistor 76 is turned "off," which disables gate 60*c*. Accordingly, when gate 60*c* and gate 60*d* are enabled, gate pair 58*b* is enabled, and delay element 46 can change the voltage at node 50 from high to low in delayed response to a change in the voltage at node 48 from high to low. In this way, when the voltage at node 48 changes from high to low, nodes 52 and 54 enable gate pair 58*b* and disable gate pair 58*a*, and, when the voltage at node 48 changes from low to high, nodes 52 and 54 enable gate pair 58*a* and disable gate pair 58*b*.

Once gate pair 58*a* has been enabled in preparation for a change in the voltage at node 48 from low to high, the voltage at node 48 changes from low to high, turning "off" p-channel transistor 78. When p-channel transistor 78 is turned "off," the voltage at node 56 is discharged over a period of time by n-channel transistor 62 from near $V_{DD}$ to near $V_{SS}$. In one embodiment, p-channel transistor 78 is "stronger" than n-channel transistor 62, and the voltage at node 56 cannot be changed from high to low until p-channel transistor 78 is turned "off." The relative strengths of p-channel and n-channel transistors may be determined by a number of factors. For example, in one embodiment, p-channel transistor 78 is approximately seventeen times shorter than n-channel transistor 62, causing p-channel transistor 78 to be stronger than n-channel transistor 62. When the voltage at node 56 reaches the threshold voltage of gate 60*b*, n-channel transistor 80 is turned "off" and, as a result, the voltage at node 50 changes from low to high. In one embodiment, n-channel transistor 80 is stronger than p-channel transistor 64, and the voltage at node 50 cannot be changed from low to high until n-channel transistor 80 is turned off. N-channel transistor 80 may be approximately seventeen times shorter than p-channel transistor 64, causing n-channel transistor 80 to be stronger than p-channel transistor 64.

According to the present invention, the threshold voltage of gate 60*b* is set at a substantially constant voltage such that the delay in node 56 reaching the threshold voltage of gate 60*b* is substantially constant over a range of supply voltages. The threshold voltage of gate 60*b* may be largely determined by the threshold voltage of n-channel transistor 80. As discussed above, associated with the output of an inverting gate are a set of plots of the output voltage of the gate versus time corresponding to a range of supply voltages, such as, for example, plots 30 illustrated in FIG. 2. The shape of each plot after a change in the input voltage is determined by the supply voltage level, and the plots intersect in a relatively narrow region defined by a relatively narrow range of voltages and a relatively narrow range of delays, such as, for example region 32 illustrated in FIG. 2. In the example of FIG. 4, the threshold voltage of gate 60*b* is set at a substantially constant voltage in the region of intersection of the plots associated with the discharge of the voltage at node 56, such that the delay in reaching the threshold voltage of gate 60*b* is substantially constant over a range of supply voltages.

As discussed above, the propagation delay through a delay element is a function of the amount time it takes the voltage at the output of a leading gate, such as gate 60*a*, to reach the threshold voltage of a following gate, such as gate 60*b*. Accordingly, the propagation delay through delay element 46 for a transition from low to high is a function of the delay in node 56 reaching the threshold voltage of gate 60*b*. If the threshold voltage of gate 60*b* is set such that the delay in reaching the threshold voltage of gate 60*b* is substantially constant over a range of supply voltages, the propagation delay through delay element 46 for a transition from low to high will also be substantially constant over that range of supply voltages.

Once gate pair 58*b* has been enabled in preparation for a change in the voltage at node 48 from high to low, the voltage at node 48 changes from high to low, turning "off" n-channel transistor 82. When n-channel transistor 82 is turned "off," the voltage at node 56 increases over a period of time from near $V_{SS}$ to near $V_{DD}$. In one embodiment, n-channel transistor 82 is stronger than p-channel transistor 70, and the voltage at node 56 cannot be changed from low to high until n-channel transistor 82 is turned "off." N-channel transistor 82 may be approximately seventeen times shorter than p-channel transistor 70, causing n-channel transistor 82 to be stronger than p-channel transistor 70. When the voltage at node 56 reaches the threshold voltage of gate 60*d*, p-channel transistor 84 is turned "off" and, as a result, the voltage at node 50 changes from high to low. In one embodiment, p-channel transistor 84 is stronger than n-channel transistor 72, and the voltage at node 50 cannot be changed from high to low until p-channel transistor 84 is turned "off." P-channel transistor 84 may be approximately seventeen times shorter than n-channel transistor 72, causing p-channel transistor 84 to be stronger than n-channel transistor 72.

The threshold voltage of gate 60*d* is set at a substantially constant voltage such that the delay in node 56 reaching the threshold voltage of gate 60*d* is substantially constant over a range of supply voltages. The threshold voltage of gate 60*d* may be largely determined by the threshold voltage of p-channel transistor 84. As discussed above, associated with the output of an inverting gate are a set of plots of the output voltage of the gate versus time corresponding to a range of supply voltages. In the example of FIG. 4, the threshold voltage of gate 60*d* is set at a substantially constant voltage in the region of intersection of the plots associated with the transition of the voltage at node 56 from low to high, such that the delay in reaching the threshold voltage of gate 60*d* is substantially constant over a range of supply voltages.

As discussed above, the propagation delay of a delay element is a function of the amount time it takes the voltage at the output of a leading gate, such as gate 60*c*, to reach the threshold voltage of a following gate, such as gate 60*d*. Accordingly, the propagation delay through delay element 46 for a transition from high to low is a function of the delay in node 56 reaching the threshold voltage of gate 60*d*. If the threshold voltage of gate 60*d* is set such that the delay in reaching the threshold voltage of gate 60*d* is substantially constant over a range of supply voltages, the propagation delay through delay element 46 for a transition from high to low will also be substantially constant.

Figure 5:
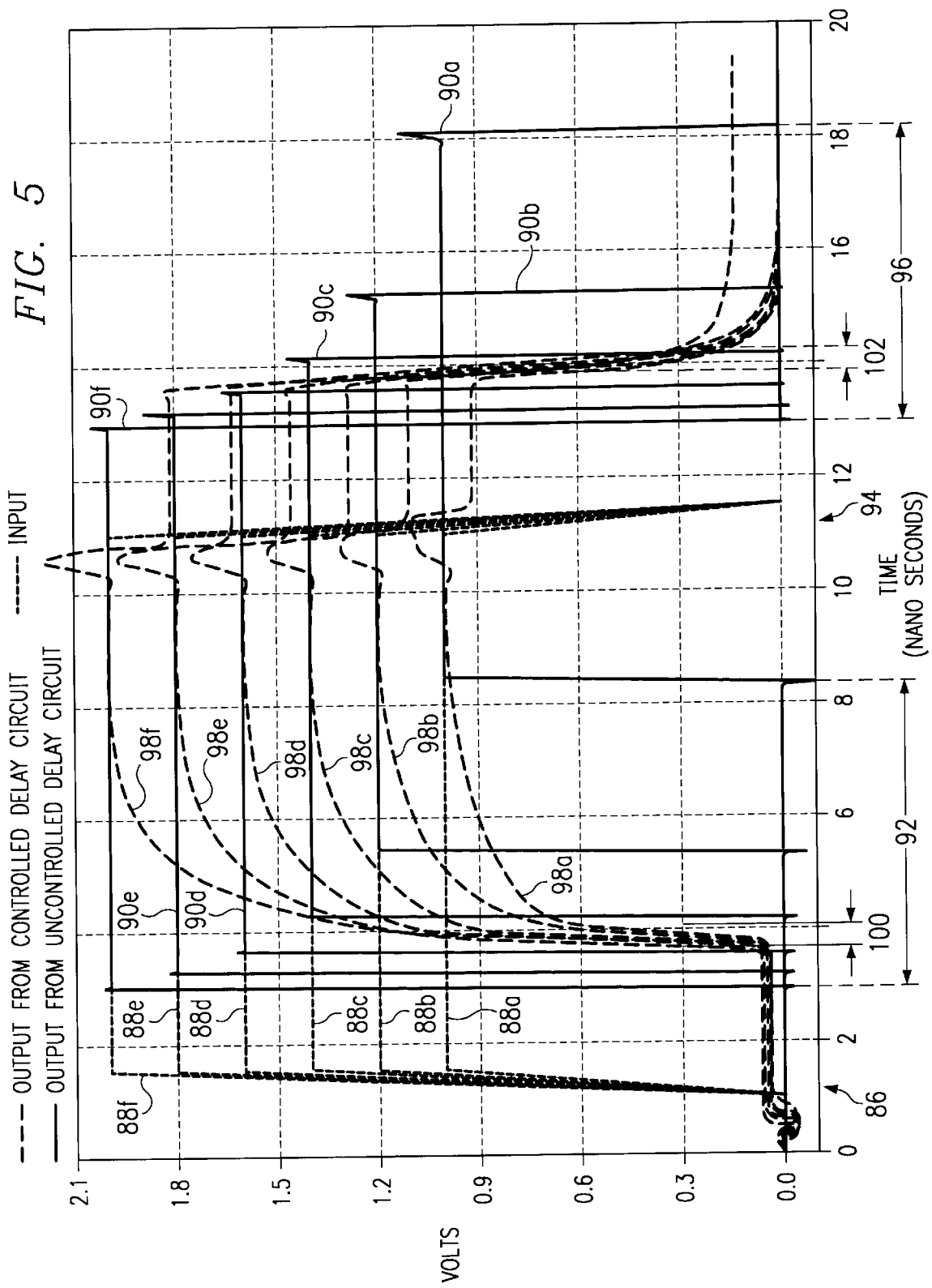
FIG. 5 illustrates exemplary plots of voltage versus time illustrating differences in propagation delay dependence on supply voltage for two different delay circuits.

FIG. 5 illustrates exemplary plots of voltage versus time illustrating differences in propagation delay dependence on supply voltage for two different delay circuits. In a particular embodiment, plots 90 and 98 are for delay circuits each having eight delay elements coupled in series, although a delay circuit may include any suitable number of delay elements according to particular needs. One delay circuit is "controlled," meaning that the propagation delay through each of the delay elements of the delay circuit is substantially constant over a range of supply voltages. The other delay circuit is "uncontrolled," meaning that the propagation delay through each of the delay elements of the delay circuit varies over a range of supply voltages. In a particular embodiment, the controlled delay circuit includes eight of the delay elements 46 described above with reference to FIG. 4 coupled in series. Node 48 of the first delay element 46 is the input node of the controlled delay circuit, node 50 of the last delay element 46 is the output node of the controlled delay circuit, and node 48 of each delay element 46 between the first delay element 46 and last delay element 46 is coupled to node 50 of the preceding delay element 46. The uncontrolled delay circuit includes eight delay elements that do not incorporate the present invention.

At a first time 86, the input voltage changes from low to high. As described above, $V_{DD}$ determines the "high" voltage and $V_{SS}$ determines the "low" voltage. Accordingly, FIG. 5 illustrates six plots 88 of the input voltage versus time, each plot 88 corresponding to a different $V_{DD}$. For example, plot 88*a* corresponds to an exemplary $V_{DD}$ of 1V, plot 88*b* corresponds to an exemplary $V_{DD}$ of 1.2V, and so on. FIG. 5 further illustrate six plots 90 of the output voltage of the exemplary uncontrolled delay circuit, each plot corresponding to a different $V_{DD}$. For example, plot 90*a* corresponds to an exemplary $V_{DD}$ of 1V, plot 90*b* corresponds to an exemplary $V_{DD}$ of 1.2V, and so on. The propagation delay through the uncontrolled delay circuit for a transition from low to high varies substantially as $V_{DD}$ varies from 1V to 2V. For example, plots 88*a* 90*a* indicate that when $V_{DD}$ is 1V the output voltage of the uncontrolled delay circuit changes from low to high approximately 7.43 ns after the input voltage changes from low to high. In contrast, plots 88*f* and 90*f* indicate that when $V_{DD}$ is 2V the output voltage of the uncontrolled delay circuit changes from low to high approximately 1.96 ns after the input voltage changes from low to high. Accordingly, the propagation delay through the exemplary uncontrolled delay circuit for a transition from low to high may be as short as approximately 1.96 ns or as long as approximately 7.43 ns, resulting in a range 92 of delays spanning approximately 5.47 ns.

Similarly, the propagation delay through the uncontrolled delay circuit for a transition from high to low varies substantially as $V_{DD}$ varies from 1V to 2V. At second time 94, the input voltage changes from high to low. Plot 88*a* and 90*a* indicate that when $V_{DD}$ is 1V the output voltage of the exemplary uncontrolled delay circuit changes from high to low approximately 7.22 ns after the input voltage changes from high to low. In contrast, plots 88*f* and 90*f*, when $V_{DD}$ is 2V the output voltage of the uncontrolled delay circuit changes from high to low approximately 1.96 ns after the input voltage changes from high to low. Accordingly, the propagation delay through the exemplary uncontrolled delay circuit for a transition from high to low may be as short as approximately 1.96 ns or as long as approximately 7.22 ns, resulting in a range 96 of delays spanning approximately 5.26 ns.

In addition to the plots of the input voltage and output voltage of the uncontrolled delay circuit, FIG. 5 includes six plots 98 of the output voltage of the exemplary controlled delay circuit, each plot corresponding to a different $V_{DD}$. For example, plot 98*a* corresponds to a $V_{DD}$ of 1V, plot 98*b* corresponds to a $V_{DD}$ of 1.2V, and so on. Compared with the propagation delay through the uncontrolled delay circuit for a transition from low to high, the propagation delay through the controlled delay circuit for a transition from low to high is substantially constant as $V_{DD}$ varies from 1V to 2V. For example, plot 88*a* and 98*a* indicate that when $V_{DD}$ is 1V the output voltage of the exemplary controlled delay circuit changes from low to high approximately 3 ns after the input voltage changes from low to high. Plot 88*f* and 98*f* indicate that when $V_{DD}$ is 2V the output voltage of the exemplary controlled delay circuit changes from low to high approximately 2.7 ns after the input voltage changes from low to high. Accordingly, the propagation delay through the exemplary controlled delay circuit for a transition from low to high may be as short as approximately 2.7 ns or as long as approximately 3 ns, resulting in a range 100 of delays spanning approximately 0.3 ns. Comparing range 100 of delays with range 92 of delays, the propagation delay through the exemplary controlled delay circuit for a transition from low to high is substantially constant for a $V_{DD}$ between 1V and 2V.

Similarly, the propagation delay through the exemplary controlled delay circuit for a transition from high to low is substantially constant as $V_{DD}$ varies from 1V to 2V. At second time 94, the input voltage changes from high to low. Plots 88*a* and 98*a* indicate that when $V_{DD}$ is 1V the output voltage of the exemplary controlled delay circuit changes from high to low approximately 2.83 ns after the input voltage changes from high to low. Plots 88*f* and 98*f* indicate that when $V_{DD}$ is 2 V the output voltage of the exemplary controlled delay circuit changes from high to low approximately 3.1 ns after the input voltage changes from high to low. Accordingly, the propagation delay through the controlled delay circuit for a transition from high to low may be as short as approximately 2.83 ns or as long as approximately 3.1 ns, resulting in a range 102 of delays spanning approximately 0.27 ns. Comparing range of delays 102 with range of delays 96, the propagation delay through the exemplary controlled delay circuit for a transition from high to low is substantially constant for a $V_{DD}$ between 1V and 2V.

Although the present invention has been described with several embodiments, many changes, variations, alterations, transformations and modifications may be suggested to one skilled in the art, and it is intended that the present invention encompasses such changes, variations, alterations, transformations, and modifications as fall within the spirit and scope of the appended claims.

What is claimed is:

1. A digital circuit element having a propagation delay that is substantially constant over a range of supply voltages applied to the digital circuit element, comprising:
   an input node;
   an output node; and
   at least one gate coupling the input node and the output node, said gate powered by a voltage source which may vary over the range of supply voltages, there being a plurality of possible voltage transition curves over the range of supply voltages associated with a corresponding change of a first voltage at the input node over time and each voltage transition curve being determined by a corresponding supply voltage, the voltage transition curves intersecting within a relatively narrow range of voltages, the gate operable to change a second voltage at the output node in response to the first voltage reaching a threshold voltage of the gate, the threshold voltage of the gate being set within the relatively narrow range of voltages in which the voltage transition curves intersect in order to reduce the dependence of the propagation delay on the supply voltage.

2. The digital circuit element of claim 1, further comprising:
   a first voltage source;
   a second voltage source, a supply voltage between the first voltage source and the second voltage source varying over a range of supply voltages; and
   wherein the gate is an inverting gate comprising:
      a p-channel transistor comprising a gate terminal coupled to the input node and a first drain terminal coupled to the output node; and
      an n-channel transistor comprising, a second source terminal coupled directly to the second voltage source and a second drain terminal coupled to the output node;
   the threshold voltage of the gate is substantially equal to a threshold voltage of the p-channel transistor; and
   the threshold voltage of the p-channel transistor is substantially independent of the supply voltage.

3. The digital circuit element of claim 1, wherein the supply voltage fluctuates as a result of noise.

4. The digital circuit element of claim 1, wherein the digital circuit element comprises a delay element.

5. The digital circuit element of claim 1, wherein:
   the digital circuit element comprises a plurality of delay elements; and
   the propagation delay is determined, at least in part, by the number of delay elements in the digital circuit element.

6. The digital circuit element of claim 1, wherein the gate is an inverting gate comprising an n-channel transistor and a p-channel transistor, each transistor comprising a gate terminal coupled to the input node, a source terminal directly coupled to a corresponding voltage source which may vary over the range of supply voltages and a drain terminal coupled to the output node.

7. The digital circuit element of claim 1, further comprising:
   a first voltage source;
   a second voltage source, a supply voltage between the first voltage source and the second voltage source varying over a range of supply voltages; and
   wherein the gate is an inverting gate comprising:
      an n-channel transistor comprising a gate terminal coupled to the input node and a first drain terminal coupled to the output node; and
      a p-channel transistor comprising, a second source terminal coupled directly to the first voltage source and a second drain terminal coupled to the output node;
   the threshold voltage of the gate is substantially equal to a threshold voltage of the n-channel transistor; and
   the threshold voltage of the n-channel transistor is substantially independent of the voltage supply.

8. A method of providing a digital circuit element having a propagation delay that is substantially constant over a range of supply voltages applied to the digital circuit element, comprising:
   providing a gate comprising an input node and an output node powered by a supply voltage varying over the range of supply voltages, there being a plurality of possible voltage transition curves over the range of supply voltages associated with a corresponding change of a first voltage at the input node over time and each voltage transition curve being determined by a corresponding supply voltage, the voltage transition curves intersecting within a relatively narrow range of voltages, the gate operable to change a second voltage at the output node in response to the first voltage reaching a threshold voltage of the gate; and
   setting the threshold voltage of the gate within the relatively narrow range of voltages in which the voltage transition curves intersect in order to reduce the dependence of the propagation delay on the supply voltage.

9. The method of claim 8, wherein the supply voltage fluctuates as a result of noise.

10. The method of claim 8, wherein the digital circuit element comprises a delay element.

11. A digital circuit element comprising:
    a first voltage source;
    a second voltage source, a supply voltage between the first voltage source and the second voltage source varying over a range of supply voltages;
    an input node receiving an input for the digital circuit element;
    an intermediate node;
    a first inverter including
       a first p-channel transistor having a first source connected directly to the first voltage source, a first gate connected to the input node and a first drain connected to the intermediate node, and
       a first n-channel transistor having a second source connected directly to the second voltage source, a second gate connected to the input node and a second drain connected to the intermediate node;
    an output node producing an output for the digital circuit element;
    a second inverter including
       a first p-channel transistor having a third source connected directly to the first voltage source, a third gate connected to the intermediate node and a third drain connected to the output node, and a second n-channel transistor having a fourth source connected directly to the second voltage source, a fourth gate connected to the intermediate node and a fourth drain connected to the output node; and wherein the first inverter having a plurality of possible voltage transition curves at the intermediate node associated with a corresponding change of a first voltage at the input node over time and each voltage transition curve being determined by a corresponding supply voltage which may vary over the range of supply voltages, the switching threshold voltage of the second inverter selected within a relatively narrow range of voltages in which the voltage transition curves of the first inverter intersect in order to reduce dependence of propagation delay on the supply voltage.

12. The digital circuit element of claim 11, wherein:

said second voltage source is ground.

13. A method for reducing propagation delay dependence, for a digital circuit element, on a supply voltage applied to the digital circuit element, comprising:

operating a gate comprising an input node and an output node from a supply voltage varying over a range of supply voltages, there being a plurality of possible voltage transition curves over the range of supply voltages associated with a corresponding change of a first voltage at the input node over time and each voltage transition curve being determined by a corresponding supply voltage, the voltage transition curves intersecting within a relatively narrow range of voltages; and changing a second voltage difference at the output node in response to the first voltage reaching a threshold voltage of the gate, the threshold voltage being set within the relatively narrow range of voltages in which the voltage transition curves intersect in order to reduce the dependence of the propagation delay on the supply voltage.

14. The method of claim 13, wherein the supply voltage fluctuates as a result of noise.

15. The method of claim 13, wherein the digital circuit element comprises a delay element.

* * * * *